United States Patent [19]

Amitay

[11] 4,253,035
[45] Feb. 24, 1981

[54] HIGH-SPEED, LOW-POWER, ITL COMPATIBLE DRIVER FOR A DIODE SWITCH

[75] Inventor: Noach Amitay, Tinton Falls, N.J.

[73] Assignee: Bell Telephone Laboratories, Incorporated, Murray Hill, N.J.

[21] Appl. No.: 16,744

[22] Filed: Mar. 2, 1979

[51] Int. Cl.³ .................. H03K 17/12; H01P 1/15; H03K 17/56
[52] U.S. Cl. .................. 307/270; 307/255; 307/262; 307/268; 307/288; 307/317 R; 333/103
[58] Field of Search .......... 307/270, 255, 288, 317 R, 307/261, 262, 268; 333/103

[56] References Cited

U.S. PATENT DOCUMENTS

| 3,103,595 | 9/1963 | Logue | 307/288 X |
| 3,497,723 | 2/1970 | Nelson | 307/268 X |
| 3,708,697 | 1/1973 | Georgopoulos | 307/270 |
| 3,710,145 | 1/1973 | Williamson et al. | 307/270 |
| 3,725,679 | 4/1973 | Darrow | 307/268 |
| 3,858,059 | 12/1974 | Khanna | 307/270 X |
| 4,196,381 | 4/1980 | Standing | 307/317 R |

OTHER PUBLICATIONS

*Microwave Diode Control Devices* by Garver, Appexdix F, pp. 359–364, copyright 1976, Artech House.
*Microwaves,* Aug. 1972, vol. 11, No. 8, pp. 50–55; "Pin–Driver Design Saves Time", by Georgopoulos.
*The Bell System Tech Journal,* Nov. 1971, vol. 50, No. 9, pp. 2917–2945, "An Experimental MM-Wave Path Length Modulator", by Clemetson et al.

*Primary Examiner*—John S. Heyman
*Attorney, Agent, or Firm*—Erwin W. Pfeifle

[57] ABSTRACT

The present invention relates to a driver for a diode switch comprising a complementary arrangement of a first and a second type of transistor across a voltage source. The first type of transistor is coupled to receive only a-c fluctuations in the input signal and is arranged to be not saturated but at cut off at the beginning of each switching subframe and be turned on for a very short time in response to a predetermined a-c input transition. The second type of transistor is coupled to receive a-c and d-c input signal fluctuations and has a resistive element for limiting the forward-biased current through the diode switch when turned on. A resistive element across the emitter collector terminals of the first type of transistor maintains the appropriate back-biasing potential on the diode switch when both transistors are cut off.

5 Claims, 3 Drawing Figures

HIGH-SPEED, LOW-POWER, ITL COMPATIBLE DRIVER FOR A DIODE SWITCH

TECHNICAL FIELD

The present invention relates to a high-speed, low-power, transistor-transistor logic (TTL) compatible driver for a diode switch and, more particularly, to a driver comprising a complementary arrangement of a first type of transistor in conjunction with a second type of transistor or an N channel enhancement FET where the base of the first type of transistor is a-c coupled to the input signal source and the base of the second type of transistor or FET is coupled to receive the a-c and d-c fluctuations of the input source.

BACKGROUND ART

A variety of circuits are known in the art for driving diode switches which use, for example, PIN diodes. One such circuit is disclosed in U.S. Pat. No. 3,710,145 issued to R. T. Williamson et al on Jan. 9, 1973 which relates to switching circuitry for semiconductor diodes especially for use in phase shifters of a phased array antenna which are controlled by a beam steering computer. The disclosed driver amplifier includes a delay circuit, an amplifying section connected to the output of the delay circuit, a first NPN output power transistor coupled to the output of the amplifying section, a second NPN output power transistor coupled to the collector feedpath of the first output power transistor in a "totem pole" arrangement which changes states in response to a state change of the first output power transistor, and a discharging transistor coupled to the input of the first output power transistor which operates to quickly remove a storage charge thereon and cause the first output power transistor into cut-off.

An article entitled "PIN-Driver Design Saves Time" by C. J. Georgopoulos in *Microwaves,* Vol. 11, No. 8, August 1972 at pp. 50–55 discloses driver circuit arrangements which use two or more transistors in a complementary arrangement or "totem pole" type arrangement. In the disclosed two transistor complementary arrangements, an NPN and PNP transistor are serially connected, with the two collectors being both interconnected and coupled to the diode switch, and each emitter is coupled through a resistor to a separate polarity of a voltage source. Each base is coupled both to a separate input signal source and through a separate resistor to the emitter of the associated transistor. In operation when one of the transistors is conducting the diode switch is forward-biased and when the other transistor is made conductive the diode switch is back-biased.

In an article "An Experimental MM-Wave Path Length Modulator" by W. J. Clemetson et al in *The Bell System Technical Journal,* Vol. 50, No. 9, November 1971 at pp. 2917–2945, in FIG. 18 there is disclosed a driver circuit for a PIN diode. The driver circuit of FIG. 18 comprises a step-recovery diode pulse generator, a high-speed flip-flop and a high-speed pulse amplifier.

In the book *Microwave Diode Control Devices* by R. V. Garver, Artech House, Inc., 1976, at Appendix F thereof, there is disclosed various arrangements for driver circuits for diode switches with one of such arrangements comprising a PNP and NPN transistor in a complementary arrangement with both transistors a-c coupled to the input.

Switching times of presently commercially available phase shifters in the 12 to 14 GHz band are usually in the 50 nanoseconds and above range and the power consumption of the combined phase shifter-driver is in the hundreds of milliwatts range for TTL compatible inputs such as, for example, memory outputs. For certain applications it is desirable to employ phase shifters which have switching times of, for example, 10 nanoseconds or less and a power consumption of less than 100 milliwatts. The problem remaining in the prior art is to provide a high-speed, low-power, TTL compatible driver for a diode switch which has the latter switching times and power consumption capabilities.

SUMMARY OF THE INVENTION

The foregoing problem has been solved in accordance with the present invention which relates to a high-speed, low-power, TTL compatible driver for a diode switch and, more particularly, to a driver for a diode switch which comprises a complementary arrangement of a first type of transistor as, for example, a PNP type transistor in conjunction with a second type of transistor as, for example, an NPN type transistor or an N channel enhancement Field Effect Transistor (FET) where the base of the first type of transistor is coupled to only receive the a-c fluctuations of an input signal and the second type of transistor or FET is coupled to receive both the a-c and d-c fluctuations of an input signal.

It is an aspect of the present invention to provide a high-speed, low-power, TTL compatible driver for a diode switch which comprises a complementary arrangement of a first type, e.g., PNP, of transistor in conjunction with either an N channel enhancement FET or a second type, e.g., NPN, of transistor across a voltage source. The base of the first type of transistor is coupled to the input via a capacitor to provide a-c coupling thereto and to the emitter thereof via a resistor to ensure that this transistor is not saturated but rather at cut-off at the beginning of each TDMA switching subframe. The base of the FET or second type of transistor is coupled to receive the steady state and a-c fluctuations appearing at the input. The diode switch is connected to the collector interconnection between the two transistors of the complementary arrangement and is forward-biased when the FET or second type of transistor is made conductive by a step function in a first direction at the input and is back-biased when the first type of transistor is made temporarily conductive by a step function in a second direction and is thereafter held in such state by a connection via a resistor across the emitter and collector of the first type of transistor once both transistors become non-conductive. A resistor between the collector of the FET or the second type of transistor and the diode switch limits the current through the diode switch when the FET or second type of transistor is conductive and the diode switch is forward-biased, and limits the current during the instant when both transistors are conductive to impress the full back-biasing voltage through the first type of transistor onto the diode switch to cause fast switching of the diode to the non-conductive state.

Other and further aspects of the present invention will become apparent during the course of the following description and by reference to the accompanying drawings.

BRIEF DESCRIPTION OF THE DRAWING

Referring now to the drawings, in which like numerals represent like parts in the several views.

DETAILED DESCRIPTION

Figure 2:
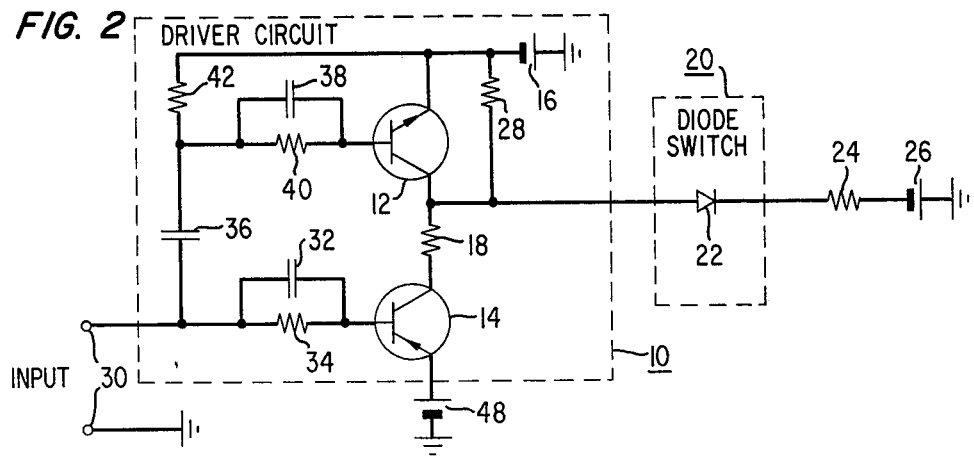
FIG. 2 is a circuit diagram of the arrangement of FIG. 1 where the transistors of the pair of different type transistors have been interchanged.
Figure 3:
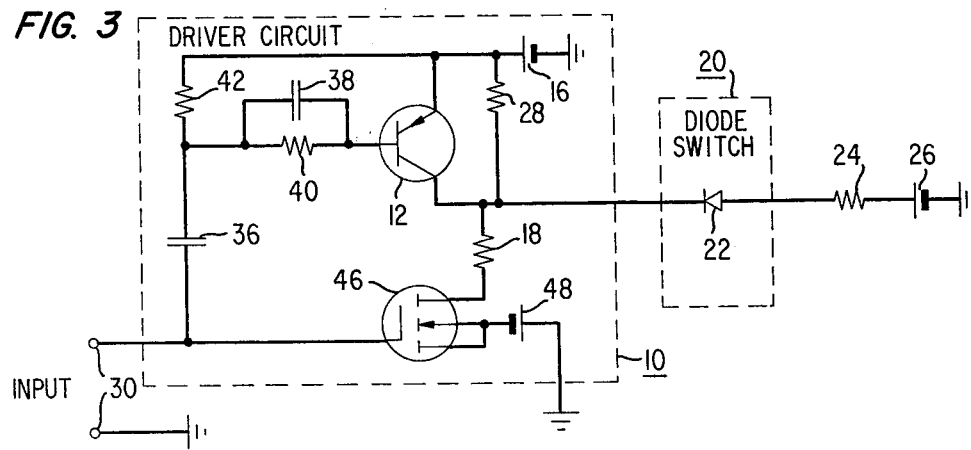
FIG. 3 is a circuit diagram of another arrangement for a driver circuit for a diode switch employing a complementary arrangement of a transistor and an N channel enhancement FET in accordance with the present invention.

The present invention will be described hereinafter primarily with relation to a PIN diode switch. However, it will be understood that such description is exemplary only and is for purposes of exposition. It will be readily appreciated that the inventive driver is equally applicable for use with other types of diode switches. It has been determined that among the prime requirements for fast switching of the PIN diodes is to maintain a high ratio of backward to forward current. In addition, the semiconductor devices used in the driver circuit should be inherently fast, with low input and output capacitances, and not be deeply saturated prior to the change of state. The driver circuits in accordance with the present invention, as shown in FIGS. 1-3, meet these requirements to provide an order of magnitude of improvement over prior art path length modulators as well as digital phase shifters which use a separate driver-diode switch combination for each bit.

Figure 1:
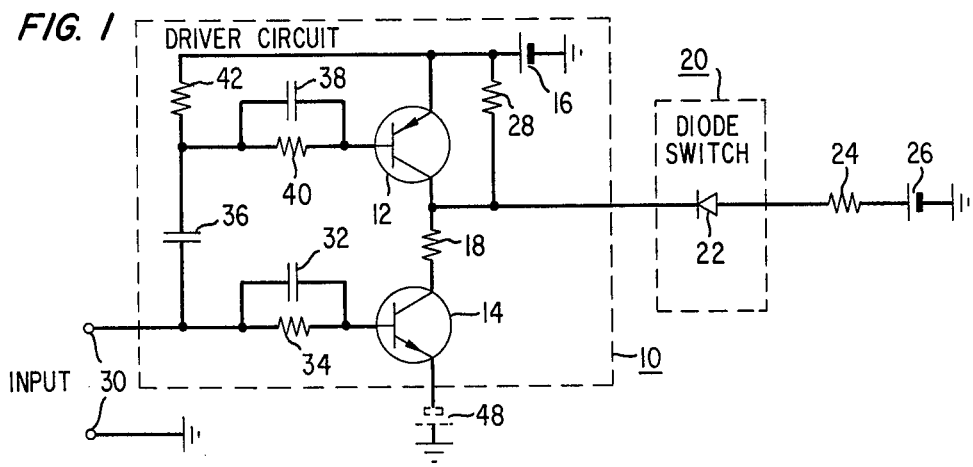
FIG. 1 is a circuit diagram of an arrangement for a driver circuit for a diode switch employing a complementary arrangement of a pair of different type transistors in accordance with the present invention.

FIG. 1 illustrates a preferred arrangement in accordance with the present invention for a driver circuit for a diode switch. The driver circuit 10 of FIG. 1 comprises a PNP type transistor 12 disposed in a complementary arrangement with an NPN type transistor 14 across a voltage source 16. A resistive element 18 is disposed in the interconnection of the collectors of transistors 12 and 14 in the complementary arrangement to (1) limit the forward current through diode switch 20, which is coupled directly to collector of transistor 12, when transistor 14 is in the conductive state, and (2) to both limit the current through both transistors 12 and 14 and impress the potential of voltage source 16 at the emitter of transistor 12 on diode 22 of diode switch 20 during the period when both transistors 12 and 14 are simultaneously conductive. A resistive element 24 is used to monitor the current from source 26 through diode 22 and transistor 14 when transistor 14 is in the conductive state and diode 22 is thereby forward-biased as well as to limit the reverse current from source 16 through diode 22 and source 26. A resistive element 28 is disposed between the emitter and collector of transistor 12 to maintain the potential from source 16 found at the emitter of transistor 12 at the adjacent terminal of diode 22 when diode 22 is in the back-bias mode when transistors 12 and 14 are in the nonconductive state.

An input signal to driver circuit 10 is received at terminals 30 and is coupled to the base of transistor 14 through a network comprising a capacitive element 32 in parallel with a resistive element 34. Capacitive element 32 functions to bypass a-c fluctuations in the input signal while resistive element 34 functions to limit the steady state current. The input signal is also coupled to the base of transistor 12 through a capacitive element 36 in series with a network comprising a capacitive element 38 in parallel with a resistive element 40. Capacitive element 36 permits only a-c fluctuations in the input signal to be impressed on the base of transistor 12 while the parallel arrangement of capacitive element 38 and resistive element 40 functions to improve the switching speed of transistor 12 by peaking the base current thereof in response to an input pulse. A resistive element 42 is connected between the emitter of transistor 12 and a point between capacitive element 36 and the capacitive element 38-resistive element 40 network. Resistive element 42 and capacitive element 36 combine to provide a time constant for the driver circuit which is dependent on their respective values.

In the operation of the driver circuit of FIG. 1, transistors 12 and 14 are normally at cut-off when the input signal is at a low-level. When the input signal voltage level goes from a low to a high level, a voltage spike will appear at the base of transistor 12 driving it further to cut-off. With a proper choice of values for resistive element 42 and capacitive element 36, the time constant of that circuit combination is, for exemplary purposes, adjusted to a predetermined value of, for example, 100 nanoseconds. At the end of a subframe of, for example, 1 to 1.5 microseconds later, the base voltage would be zero and transistor 12 is still cut off. Concurrently, when the input signal voltage level goes from a low to a high level, transistor 14 will be turned on fast and PIN diode 22 will be forward biased. Resistive element 18 is used to limit the forward current through diode 22 to a predetermined level of, for example, approximately 2.5 milliamperes while resistive element 24 monitors the current through the diode 22.

When the input voltage level next goes from a high to a low level, transistor 14 is turned off and a negative spike will appear at the base of transistor 12 which will turn this transistor on. Transistor 12 after being turned on will initially act as a current source. At this point, the differential resistance of diode 22 will be very low and effectively much less than resistive elements 18 and 24. Consequently, a high current of, for example, 10 or 20 times the forward current can be pushed initially through diode 22 even if transistor 14 is not turned off completely. This current, limited slightly by resistive element 24, will force the diode 22 into the reverse- or back-bias state. Due to the low resistance of the base-emitter junction of transistor 12 and the value of capacitive element 36, transistor 12 will stay turned on for only a short period of time, typically tens of nanoseconds. By that time PIN diode 22 will be discharged of carriers and the potential of source 16 appearing at the emitter of transistor 12 will appear at diode 22. This potential will be maintained at diode 22 by resistive element 28 for the remainder of the subframe period.

In accordance with the present invention, very short switching times are obtainable by a-c coupling transistor 12 to the input 30 and also insuring that transistor 12 is not saturated but rather at cut-off at the beginning of each subframe period. An optional voltage source 48 can be used to pre-bias and accelerate the turning on of transistor 14 and thereby further reduce the switching time of diode 22. Additionally, very low power is drawn from source 16 and by drawing the forward current of PIN diode 22 from a low voltage source 26 the power consumption of the driver circuit 10 is further reduced over arrangements where only one source is used for the driver circuit 10 and switch 20. The power supplies 16, 26 and 48, of course, can be shared by all the other driver and switching circuits of, for example, all the phase shifters in an antenna array.

Typical codes and values for the components of the arrangement of FIG. 1 are:

| Element No. | Code or Value | Element No. | Code or Value |
|---|---|---|---|
| 12 | Code 2N4261 | 32 | 30–33pF |
| 14 | Code HP35824A | 34 | 4.7–5KΩ |
| 16 | 14.5 V. | 36 | 12pF |
| 18 | 100Ω | 38 | 82pF |
| 24 | 20Ω | 40 | 470Ω |
| 26 | 1.5–2 V. | 42 | 2.2KΩ |
| 28 | 100KΩ | 48 | −0.2 V. |

It is to be understood that such codes and values are only exemplary codes and values and should not be deemed as limitations of the present driver circuit of FIG. 1.

FIG. 2 is an arrangement of the driver circuit 10 and diode switching circuit 20 similar to the arrangement of FIG. 1 except that transistor 12 is an NPN type transistor and transistor 14 is a PNP type transistor. To achieve the same operation as that described hereinbefore for the arrangement of FIG. 1, the polarities of sources 16, 26 and 48 would have to be inverted from that shown in FIG. 1 and PIN diode 22 would have to be reversed in direction from that shown in FIG. 1 in the manner shown in FIG. 2. Additionally, as would be evident to those skilled in the art, an initial variation of the input signal voltage level from a high to a low level will cause transistor 12 to be driven further to cut off and transistor 14 will be turned on. When the input voltage level next goes from a low level to a high level, transistor 14 will be turned off and transistor 12 is momentarily turned on. The remaining sequence would correspond to that described for the arrangement of FIG. 1.

FIG. 3 illustrates another arrangement for the present driver circuit similar to the arrangement of FIG. 1 except that transistor 14 of FIG. 1 is replaced by an N channel enhancement Field Effect Transistor (FET) 46, the gate terminal of which is directly connected to input terminal 30. A separate low voltage source 48 is coupled to the substrate-source interconnected terminals of FET 46. Source 48 is primarily used in the arrangement of FIG. 3 to accelerate the turning on of FET 46 when the input voltage level goes from a low to a high level at the beginning of a TDMA subframe.

Typical codes and values for the components of the arrangement of FIG. 3 are:

| Element No. | Code or Value | Element No. | Code or Value |
|---|---|---|---|
| 12 | Code 2N4261 | 36 | 12pF |
| 16 | 14.5 V. | 38 | 82pF |
| 18 | 100Ω | 40 | 470Ω |
| 24 | 20Ω | 42 | 2.2KΩ |
| 26 | 0.5–1 V. | 46 | Code SD210 |
| 28 | 100KΩ | 48 | −1.5 to −1.0 V. |

It is to be understood that such codes and values are merely presented for purpose of exposition and not for purpose of limitation since other codes and values could be substituted and still provide an operable driver circuit.

The input signal at terminals 30 to driver circuit 10 of FIGS. 1–3, can be derived, inter alia, from either a low-power Schottky Transistor-Transistor Logic (TTL) output or another source of fast rise and fall time pulses with TTL voltage levels. The duration of the on and off pulses can be, for example, 1 microsecond in duration corresponding to a subframe duration. Using TTL inputs, the present arrangements using the indicated exemplary codes and values have been found to provide transition times of less than 2 nanoseconds while with fast rise and fall time pulses transistion times of approximately 1 nanosecond were obtained. The d-c power consumption of the driver circuit of FIG. 1 feeding two diodes, using 1 microsecond on and off pulses with a forward current of 5 mA, was found to be approximately 8.75 mA. For the arrangement of FIG. 3, the average power consumption should be approximately 10.1 to 14 mW due to the higher voltage of the forward current power supplies 26 and 48. For the insertion loss obtained, the switching speeds and power consumption of the present arrangements incorporated in a 4-bit digital phase shifter appear to be at least an order of magnitude better than found in the best presently available phase shifters.

It is to be understood that the above-described embodiments are simply illustrative of the principles of the invention. Various other modifications and changes may be made by those skilled in the art which will embody the principles of the invention and fall within the spirit and scope thereof.

I claim:

1. A high-speed, low-power, driver for a diode switch comprising:

an input terminal (30) capable of being coupled to an input signal source;

an output coupled to the diode switch; and a first type of transistor (12) and a second type of transistor (14) coupled in a complementary arrangement across a voltage source (16), the first type of transistor comprising a base, a collector and an emitter with said base being coupled to both the input terminal through a capacitive element (36) and said emitter through a first resistive element (42) with the combination of said capacitive and first resistive element providing a predetermined time constant while permitting a-c fluctuations only in an input signal to affect the first type of transistor, and the output to the diode switch being taken from the interconnection in the complementary arrangement between the first type and second type of transistor.

CHARACTERIZED IN THAT the second type of transistor is coupled to the input terminal to permit both a-c and d-c fluctuations in an input signal to be impressed thereon; and the driver further comprises:

a second resistive element (28) coupled between the emitter and the collector of the first type of transistor to provide the proper bias across the diode switch in the back bias mode when both transistors are in the nonconductive state; and a third resistive element (18) coupled between the output to the diode switch and the second type of transistor in the interconnection in the complementary arrangement between the first type and second type of transistor for limiting the current through the diode switch in the forward bias mode when the second type of transistor is conductive and the first type of transistor is nonconductive and when both transistors are in the conductive state to limit the current through the second type of transistor to impress the voltage level at the voltage source terminal connected to the emitter of the first type of transistor on the output terminal and cause the diode switch to be back-biased and made nonconductive.

2. A driver for a diode switch in accordance with claim 1, wherein the first type of transistor is a PNP type transistor and the second type of transistor is an NPN type transistor comprising a base, an emitter and a collector

CHARACTERIZED IN THAT the second type of transistor (14) has its base coupled to the input terminal through a parallel arrangement of a capacitive element (32) and a resistive element (34).

3. A driver circuit for a diode switch in accordance with claim 1, wherein the firt type of transistor is an NPN type of transistor and the second type of transistor is a PNP type of transistor comprising a base, an emitter and a collector

CHARACTERIZED IN THAT the second type of transistor (14) has its base coupled to the input terminal through a parallel arrangement of a capacitive element (32) and a resistive element (34).

4. A driver circuit for a diode switch in accordance with claim 1, wherein the first type of transistor is a PNP type of transistor

CHARACTERIZED IN THAT the second type of transistor is an N channel enhancement type field-effect transistor (46) comprising a gate, a drain, a source and a substrate electrode, the gate electrode being coupled directly to the input terminal and the source and substrate electrodes are coupled together and to a voltage source (48).

5. A driver circuit for a diode switch in accordance with either claim 1, 2, 3 or 4

CHARACTERIZED IN THAT a network comprising a parallel arrangement of a capacitive element (38) and a resistive element (40) is coupled between the base of the first type of transistor and the common connection of the first resistive element (42) and capacitive element (36) coupling said base to the input terminal.

* * * * *

UNITED STATES PATENT AND TRADEMARK OFFICE
CERTIFICATE OF CORRECTION

PATENT NO. : 4,253,035

DATED : February 24, 1981

INVENTOR(S) : N. Amitay

It is certified that error appears in the above—identified patent and that said Letters Patent is hereby corrected as shown below:

In the title "ITL" should read --TTL--.

Signed and Sealed this

Twenty-third Day of June 1981

[SEAL]

Attest:

RENE D. TEGTMEYER

Attesting Officer     Acting Commissioner of Patents and Trademarks